(12) United States Patent
Shen et al.

(10) Patent No.: US 12,181,769 B2
(45) Date of Patent: Dec. 31, 2024

(54) DISPLAY DEVICE AND VEHICLE

(71) Applicant: WUHAN CHINA STAR OPTOELECTRONICS SEMICONDUCTOR DISPLAY TECHNOLOGY CO., LTD., Wuhan (CN)

(72) Inventors: Haiyan Shen, Wuhan (CN); Zhimeng Luo, Wuhan (CN); Le Zhang, Wuhan (CN); Wenxu Xianyu, Wuhan (CN); Chunpeng Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 137 days.

(21) Appl. No.: 17/875,603

(22) Filed: Jul. 28, 2022

(65) Prior Publication Data
US 2024/0004256 A1   Jan. 4, 2024

(30) Foreign Application Priority Data

Jun. 30, 2022   (CN) .......................... 202210768547.0

(51) Int. Cl.
*G02F 1/1685* (2019.01)
*B60K 35/00* (2006.01)
(Continued)

(52) U.S. Cl.
CPC ............ *G02F 1/1685* (2019.01); *B60K 35/00* (2013.01); *G02F 1/13394* (2013.01);
(Continued)

(58) Field of Classification Search
CPC ...... G02F 1/1685; G02F 1/167; G02F 1/1347; G02F 1/1679; G02F 1/1676; G02F 1/1681; G02F 2001/1678; G02F 2203/30
See application file for complete search history.

(56) References Cited

U.S. PATENT DOCUMENTS

2014/0192401 A1*   7/2014  An ........................... G02F 1/167
                                                               359/296
2020/0050010 A1*   2/2020  Zheng .................... G02B 27/46

FOREIGN PATENT DOCUMENTS

CN         107540708 A        1/2018
CN         110571257 A       12/2019
(Continued)

OTHER PUBLICATIONS

Chinese Office Action issued in corresponding Chinese Patent Application No. 202210768547.0 dated Aug. 13, 2024, pp. 1-9, 21pp.

*Primary Examiner* — Angela M. Medich
(74) *Attorney, Agent, or Firm* — The Roy Gross Law Firm, LLC; Roy Gross

(57) ABSTRACT

A display device and a vehicle are disclosed. The display device includes a display panel and an electrophoretic color changing layer disposed on one side of the display panel. The electrophoretic color changing layer includes a plurality of electrophoretic color changing devices, the electrophoretic color changing devices are disposed corresponding to transparent sub areas, and the electrophoretic color changing devices can transition between transparent and opaque states.

18 Claims, 6 Drawing Sheets

(51) Int. Cl.
  *G02F 1/1339* (2006.01)
  *G02F 1/1343* (2006.01)
  *G02F 1/167* (2019.01)
  *G02F 1/1676* (2019.01)
  *G02F 1/1679* (2019.01)
  *H10K 59/50* (2023.01)
  *B60K 35/22* (2024.01)
  *G02F 1/16756* (2019.01)

(52) U.S. Cl.
  CPC ........ *G02F 1/134309* (2013.01); *G02F 1/167* (2013.01); *G02F 1/1676* (2019.01); *G02F 1/1679* (2019.01); *H10K 59/50* (2023.02); *B60K 35/22* (2024.01); *B60K 2360/33* (2024.01); *G02F 1/13439* (2013.01); *G02F 1/16756* (2019.01); *G02F 2203/30* (2013.01)

(56)    References Cited

FOREIGN PATENT DOCUMENTS

| | | |
|---|---|---|
| CN | 111240121 A | 6/2020 |
| CN | 112379560 A | 2/2021 |
| CN | 216435908 U | 5/2022 |

\* cited by examiner

DISPLAY DEVICE AND VEHICLE

CROSS REFERENCE TO RELATED APPLICATIONS

This application claims the benefit of priority of Chinese Patent Application No. 202210768547.0, filed Jun. 30, 2022, the contents of which are all incorporated herein by reference in their entirety.

FIELD OF INVENTION

The present disclosure relates to the field of display technologies, and more particularly, to a display device and a vehicle.

BACKGROUND OF INVENTION

Organic light-emitting diode (OLED) display panels or display devices have been widely used in people's lives, such as mobile phones, computers, or other display screens. With development of display technologies, the organic light-emitting diode (OLED) display panels have a wider and wider range of applications, for example, transparent organic light-emitting display panels or transparent organic light-emitting display devices are applied to glass on vehicles.

However, when transparent display devices are applied to the glass of the vehicles in current technology, ambient light that transmits transparent regions of the transparent display devices will affect the display effect, and especially an image-viewing effect is poor when displayed in low grayscales. At a same time, the transparent display devices cannot shield external heat and ultraviolet rays, thereby causing strong light stimulation to passengers.

SUMMARY OF INVENTION

An embodiment of the present disclosure provides a display device and a vehicle, which can solve following problems: when transparent display devices are applied to glass of vehicles in current technology, ambient light that transmits transparent regions of the transparent display devices will affect the display effect, especially an image-viewing effect is poor when displayed in low grayscales, and at a same time, the transparent display devices cannot shield external heat and ultraviolet rays, causing strong light stimulation to passengers.

An embodiment of the present disclosure provides a display device, which has a display area and a non-display area surrounding at least a part of the display area, wherein, the display area includes a plurality of display sub areas and a plurality of transparent sub areas arranged in an array, and the display device includes:
  a display panel including a substrate and a plurality of light-emitting devices disposed on the substrate, wherein, the light-emitting devices are disposed corresponding to the display sub areas; and
  an electrophoretic color changing layer disposed on one side of the display panel.
Wherein, the electrophoretic color changing layer includes a plurality of electrophoretic color changing devices, the electrophoretic color changing devices are disposed corresponding to the transparent sub areas, and the electrophoretic color changing devices can transition between a transparent state and an opaque state.

Optionally, in some embodiments of the present disclosure, the electrophoretic color changing layer includes a first substrate, a second substrate, and barrier walls, the barrier walls are disposed between the first substrate and the second substrate, and the barrier walls are surrounded to form the plurality of electrophoretic color changing devices.

Optionally, in some embodiments of the present disclosure, the electrophoretic color changing layer further includes a plurality of transmission units, and the transmission units are disposed corresponding to the display sub areas and between adjacent electrophoretic color changing devices.

Optionally, in some embodiments of the present disclosure, the electrophoretic color changing layer further includes a sealant attached between the first substrate and the second substrate, and the sealant is disposed between the first substrate and the second substrate and in the non-display area.

Optionally, in some embodiments of the present disclosure, the electrophoretic color changing layer further includes a first electrode layer, the first electrode layer includes first electrodes and second electrodes corresponding to the electrophoretic color changing devices by one to one, and a first electrode and a second electrode in a same electrophoretic color changing device are spaced apart from each other; and each of the electrophoretic color changing devices further includes charged particles disposed on one side of the first electrodes and the second electrodes, and the charged particles move in the electrophoretic color changing devices according to a voltage change between the first electrodes and the second electrodes.

Optionally, in some embodiments of the present disclosure, the first electrode layer is disposed on the first substrate or the second substrate.

Optionally, in some embodiments of the present disclosure, the first electrodes are transparent electrodes, and the first electrodes are disposed corresponding to the transparent sub areas.

Optionally, in some embodiments of the present disclosure, the display area further includes non-transparent sub areas between the display sub areas and the transparent sub areas, and the second electrodes are at least partially disposed corresponding to the non-transparent sub areas.

Optionally, in some embodiments of the present disclosure, the electrophoretic color changing layer further includes a second electrode layer and an isolation insulating layer disposed on the first substrate or the second substrate, the second electrode layer is disposed between the first electrode layer and the first substrate or between the first electrode layer and the second substrate, the isolation insulating layer is disposed between the first electrode layer and the second electrode layer, and the first electrode layer and the second electrode layer are disposed on a same substrate;
  the first electrode layer further includes connection electrodes connected between adjacent first electrodes; and
  the second electrode layer further includes first wirings, and the second electrodes are electrically connected to each other by the first wirings.

Optionally, in some embodiments of the present disclosure, at least three light-emitting devices having different colors are disposed in one display sub area, the transparent sub areas are disposed between adjacent display sub areas, and in the same electrophoretic color changing device, the second electrode is disposed on at least one side of the first electrode.

Optionally, in some embodiments of the present disclosure, the barrier walls are at least partially disposed on the first electrodes or the second electrodes.

Optionally, in some embodiments of the present disclosure, the display panel further includes an encapsulation layer disposed on one side of the light-emitting devices away from the substrate, and the first substrate is the substrate of the display panel or the encapsulation layer of the display panel.

Optionally, in some embodiments of the present disclosure, the first substrate is the encapsulation layer, and both the first electrodes and the second electrodes are disposed on the encapsulation layer.

Optionally, in some embodiments of the present disclosure, the barrier walls are organic materials formed on the first substrate.

Optionally, in some embodiments of the present disclosure, the display panel further includes an encapsulation layer and transistors and openings disposed between the substrate and the encapsulation layer, the light-emitting devices are disposed on the transistors, the encapsulation layer is disposed on the light-emitting devices, the openings are defined corresponding to the transparent sub areas and penetrate at least inorganic material film layers of the transistors, and a filling material in the openings includes an organic material.

Optionally, in some embodiments of the present disclosure, when a first voltage is applied between the first electrodes and the second electrodes, the charged particles are gathered on the first electrodes, and the transparent sub areas are in the opaque state;

when a second voltage is applied between the first electrodes and the second electrodes, the charged particles are gathered on the second electrodes, and the transparent sub areas are in the transparent state; and wherein, the first voltage and the second voltage are reverse voltages.

Optionally, in some embodiments of the present disclosure, when a third voltage is applied between the first electrodes and the second electrodes, the charged particles are distributed on the first electrodes and the second electrodes, the transparent sub areas are in a grayscale state, and an absolute value of the third voltage is less than an absolute value of the first voltage and an absolute value of the second voltage.

Correspondingly, an embodiment of the present disclosure further provides a vehicle, which includes the display device mentioned in any one of the above embodiments.

In the embodiments of the present disclosure, the display device and the vehicle are provided. The display device includes the display area and the non-display area surrounding at least a part of the display area, and the display area includes the plurality of display sub areas and the plurality of transparent sub areas arranged in an array. The display device includes: a display panel including the substrate and the plurality of light-emitting devices disposed on the substrate, wherein, the light-emitting devices are disposed corresponding to the display sub areas; and the electrophoretic color changing layer disposed on one side of the display panel. The electrophoretic color changing layer includes the plurality of electrophoretic color changing devices, the electrophoretic color changing devices are disposed corresponding to the transparent sub areas, and the electrophoretic color changing devices can transition between transparent and opaque states. In the present disclosure, the electrophoretic color changing devices in the electrophoretic color changing layer are disposed corresponding to the transparent sub areas. When the display device displays images, the electrophoretic color changing devices can be transformed into the opaque state to improve a display quality of the images, especially low grayscale displayed images having high quality, and at a same time, to block external heat and ultraviolet rays, thereby preventing strong light stimulation to passengers. When the display device does not display images and the passengers need to observe external environment from the vehicle, the electrophoretic color changing devices can be transformed into the transparent state, the display device can have a high transmittance effect, and the passengers can observe outside very well.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
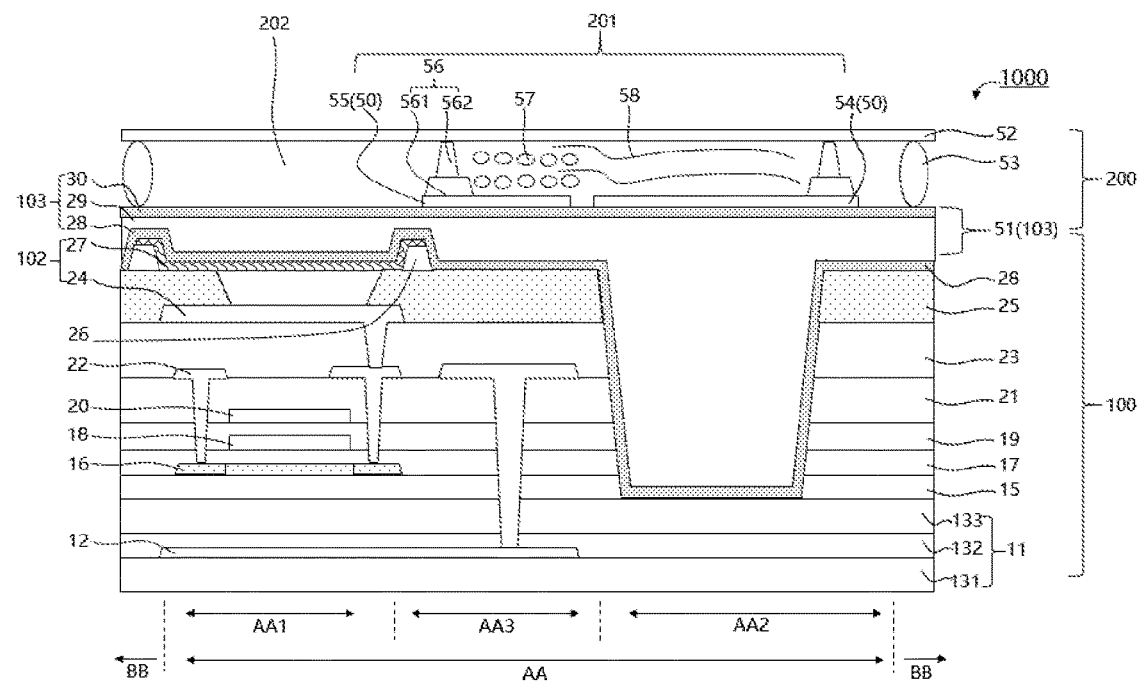
FIG. 1 is a first schematic cross-sectional structural diagram of a display device according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device.

An embodiment of the present disclosure provides a display device, which includes a display area and a non-display area surrounding at least a part of the display area, and the display area includes a plurality of display sub areas and a plurality of transparent sub areas arranged in an array. The display device includes: a display panel including a substrate and a plurality of light-emitting devices disposed on the substrate, wherein, the light-emitting devices are disposed corresponding to the display sub areas; and an electrophoretic color changing layer disposed on one side of the display panel. Wherein, the electrophoretic color changing layer includes a plurality of electrophoretic color changing devices, the electrophoretic color changing devices are disposed corresponding to the transparent sub areas, and the electrophoretic color changing devices can transition between transparent and opaque states. An embodiment of the present disclosure further provides a vehicle including the display device mentioned above. The following will describe them in detail, respectively. It should be noted that an order of description in the following embodiments is not meant to limit a preferred order of the embodiments.

Embodiment 1

Figure 2:
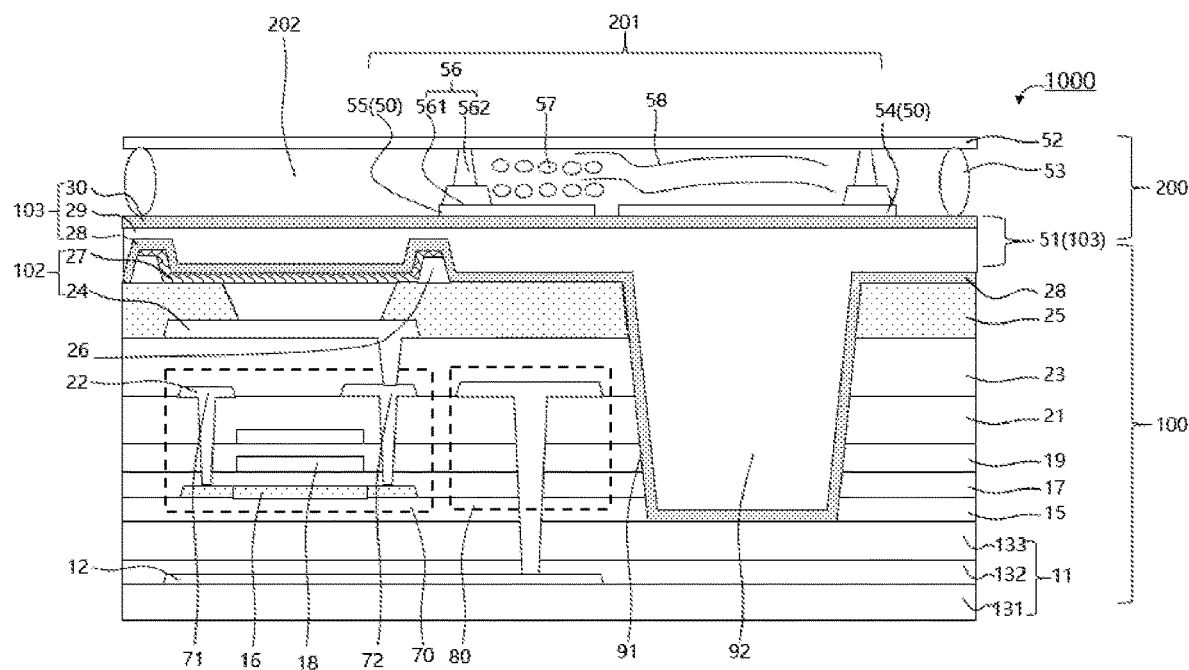
FIG. 2 is a second schematic cross-sectional structural diagram of the display device according to an embodiment of the present disclosure.
Figure 3:
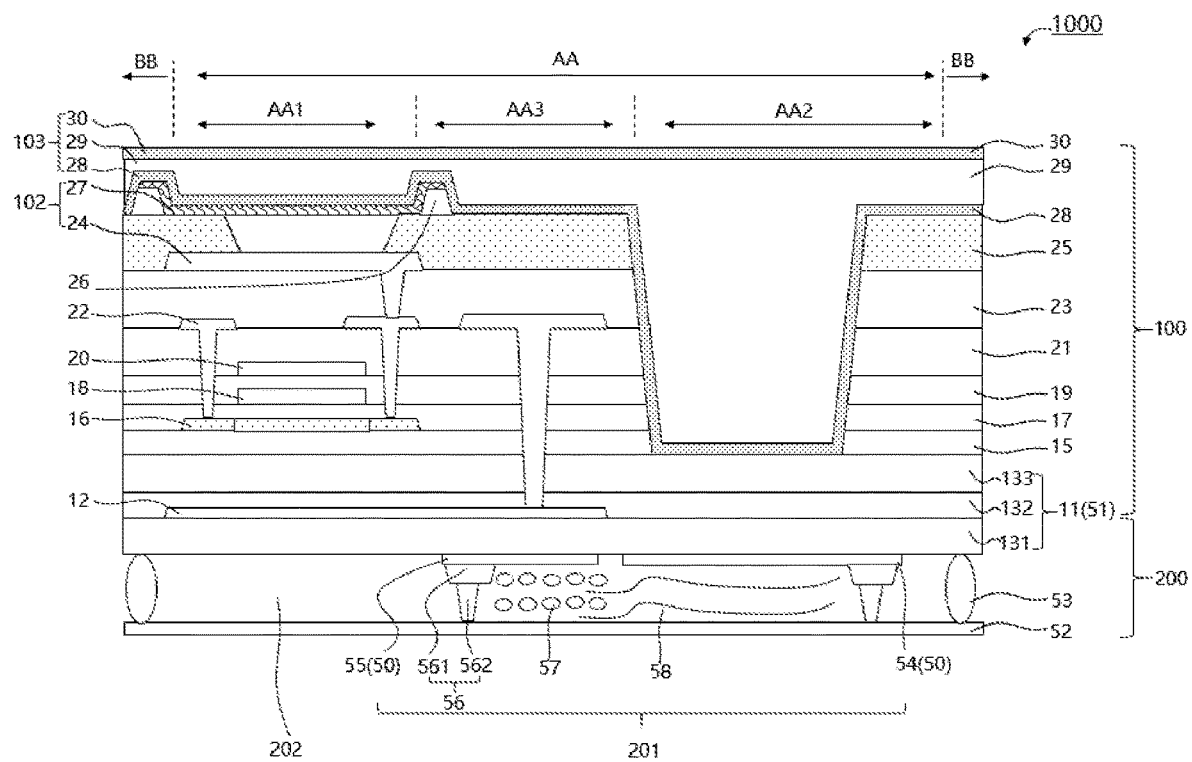
FIG. 3 is a third schematic cross-sectional structural diagram of the display device according to an embodiment of the present disclosure.
Figure 4:
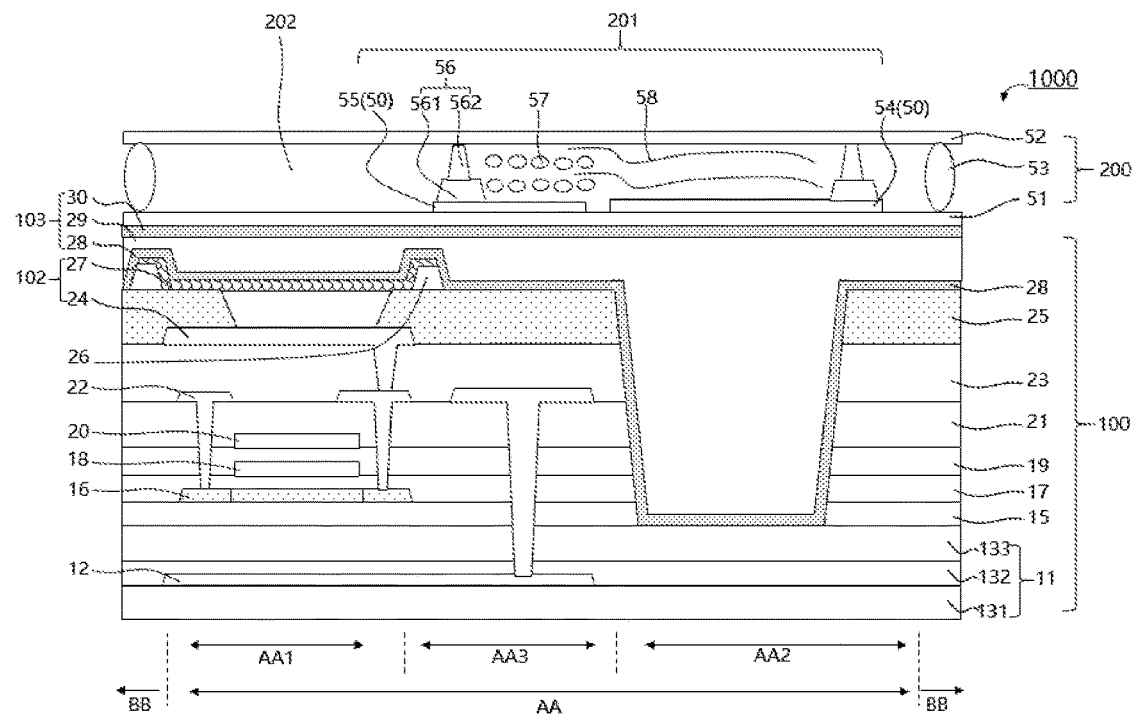
FIG. 4 is a fourth schematic cross-sectional structural diagram of the display device according to an embodiment of the present disclosure.
Figure 8:
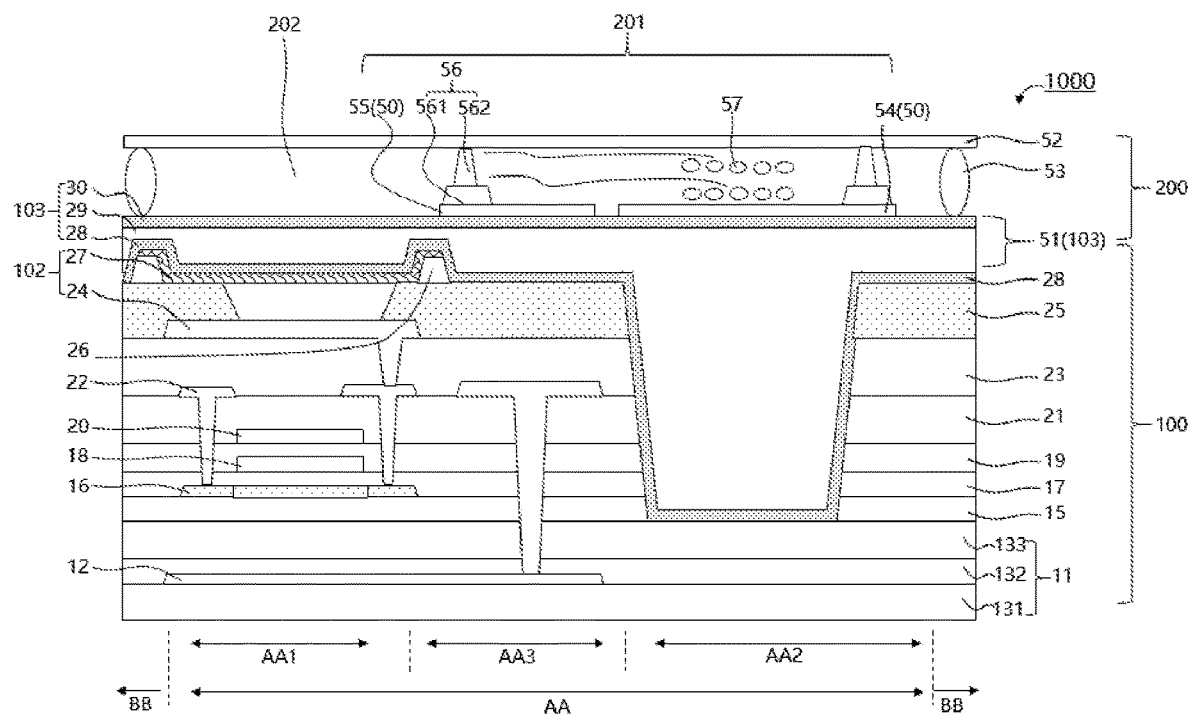
FIG. 8 is a schematic diagram of a first state of the display device according to an embodiment of the present disclosure.
Figure 9:
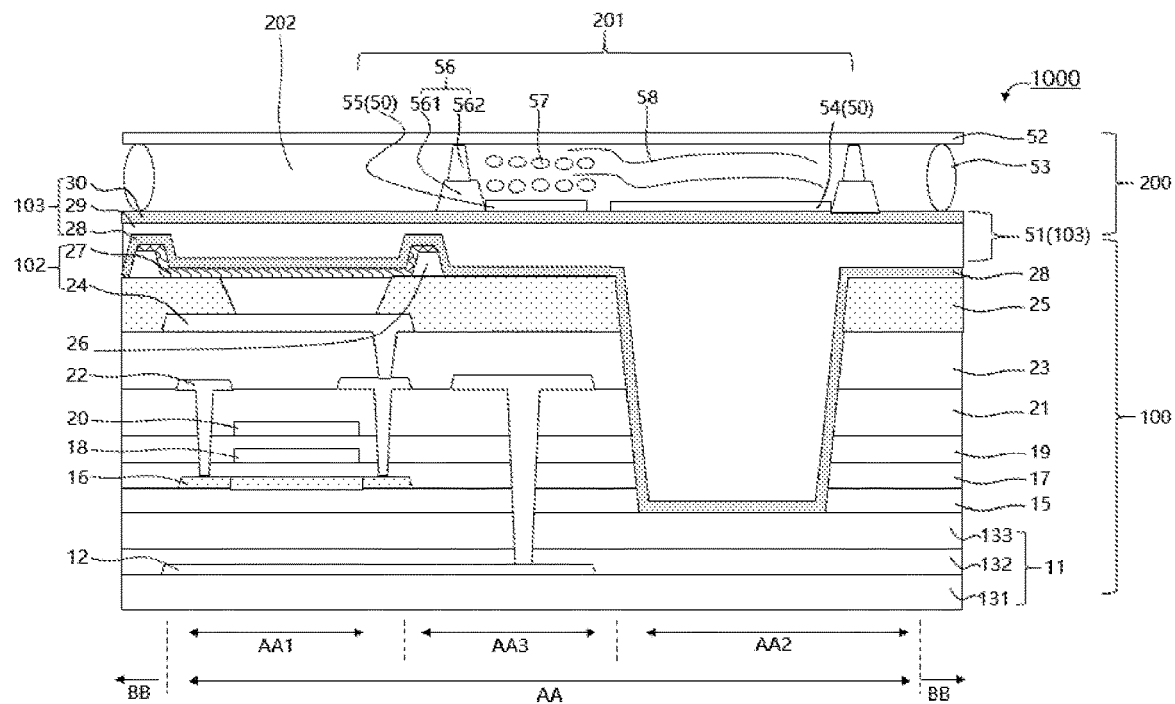
FIG. 9 is a schematic diagram of a second state of the display device according to an embodiment of the present disclosure.
Figure 10:
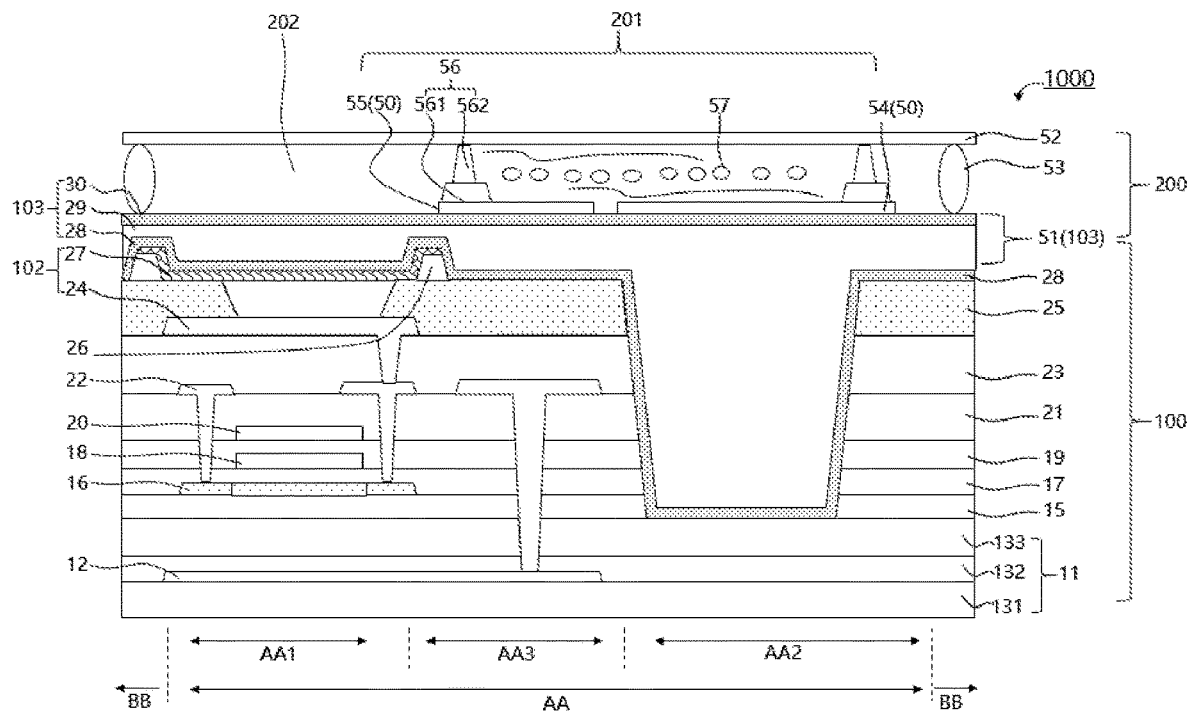
FIG. 10 is a schematic diagram of a third state of the display device according to an embodiment of the present disclosure.

Referring to FIGS. 1 to 4 and 8 to 10, FIG. 1 is a first schematic cross-sectional structural diagram of a display device 1000 according to an embodiment of the present disclosure; FIG. 2 is a second schematic cross-sectional structural diagram of the display device 1000 according to an embodiment of the present disclosure; FIG. 3 is a third schematic cross-sectional structural diagram of the display device 1000 according to an embodiment of the present disclosure; FIG. 4 is a fourth schematic cross-sectional structural diagram of the display device 1000 according to an embodiment of the present disclosure; FIG. 8 is a schematic diagram of a first state of the display device 1000 according to an embodiment of the present disclosure; FIG. 9 is a schematic diagram of a second state of the display device 1000 according to an embodiment of the present disclosure; and FIG. 10 is a schematic diagram of a third state of the display device 1000 according to an embodiment of the present disclosure. The structure of FIG. 2 is the same as that of FIG. 1, a difference is that for convenience of labeling, reference numbers of some structures in FIG. 1 are shown in FIG. 2.

An embodiment of the present disclosure provides a display device 1000, which includes a display area AA and a non-display area BB surrounding at least a part of the display area AA, and the display area AA includes a plurality of display sub areas AA1 and a plurality of transparent sub areas AA2 arranged in an array. The display device 1000 includes a display panel 100 and an electrophoretic color changing layer 200. The display panel 100 includes a substrate 11 and a plurality of light-emitting devices 102 disposed on the substrate 11, and the light-emitting devices 102 are disposed corresponding to the display sub areas AA1. The electrophoretic color changing layer 200 is disposed on one side of the display panel 100. Wherein, the electrophoretic color changing layer 200 includes a plurality of electrophoretic color changing devices 201, the electrophoretic color changing devices 201 are disposed corresponding to the transparent sub areas AA2, and the electrophoretic color changing devices 201 can transition between transparent and opaque states.

Specifically, as shown in FIG. 1, the display device 1000 includes the display area AA and the non-display area BB at least partially surrounding the display area AA. The non-display area BB may also completely surround the display area AA, for example, the non-display area BB surrounds the display area AA from all sides, which is not limited herein.

Specifically, the display panel 100 may be an organic light-emitting diode (OLED) display panel, the display panel 100 may be a liquid crystal display panel, or the display panel 100 may be a micro-light-emitting diode display panel, which is not limited herein. In this embodiment, the display panel 100 being the organic light-emitting diode display panel is taken as an example for description.

Specifically, the display area AA includes the plurality of display sub areas AA1 and the plurality of transparent sub areas AA2 arranged in the array. The display area AA may include a plurality of independent transparent sub areas AA2 disposed in the display area AA in an array, or the transparent sub areas AA2 are disposed between the display sub areas AA1 in an array.

Specifically, the display panel 100 includes the substrate 11 and the plurality of light-emitting devices 102 disposed on the substrate 11. The plurality of light-emitting devices 102 may include a plurality of red light-emitting devices, a plurality of green light-emitting devices, and a plurality of blue light-emitting devices, which is not limited herein. Each of the light-emitting devices 102 may include an anode 24, a cathode 27, and a light-emitting material layer sandwiched between the anode 24 and the cathode 27.

Specifically, the light-emitting devices 102 are disposed corresponding to the display sub areas AA1, the light-emitting devices 102 are disposed in first openings of a pixel definition layer 25, and a size of the display sub areas AA1 may be greater than or equal to a size of the first openings that accommodate the light-emitting devices 102.

Specifically, the display area AA includes the plurality of display sub areas AA1 and the plurality of transparent sub areas AA2, the display sub areas AA1 are used to display images, and the transparent sub areas AA2 are used to provide a channel for ambient light to pass through the display device 1000. The ambient light can pass from one side of the display device 1000 to another side of the display device 1000 through the transparent sub areas AA2.

Specifically, the electrophoretic color changing devices 201 are disposed corresponding to the transparent sub areas AA2, and each of the electrophoretic color changing devices 201 includes a first electrode 54 and a second electrode 55. The first electrode 54 is located in the transparent sub areas AA2, or a most area of the first electrode 54 is located in the transparent sub areas AA2.

Specifically, the electrophoretic color changing layer 200 is disposed on one side of the display panel 100. As shown in FIG. 1, FIG. 1 shows that the electrophoretic color changing layer 200 is disposed on one side of an encapsulation layer 103 of the display panel 100 away from the substrate 11. FIG. 3 shows that the electrophoretic color changing layer 200 is disposed on one side of the substrate 11 of the display panel 100 away from the encapsulation layer 103.

Specifically, the electrophoretic color changing layer 200 includes the plurality of electrophoretic color changing devices 201, and the electrophoretic color changing devices 201 are disposed corresponding to the transparent sub areas AA2 in an array. Although only one electrophoretic color changing device 201 is illustrated in FIGS. 1 to 7, it can be understood that the display device 1000 in FIGS. 1 to 7 includes the plurality of electrophoretic color changing devices 201 and the plurality of transparent sub areas AA2.

Specifically, the electrophoretic color changing layer 200 includes the plurality of electrophoretic color changing devices 201, the electrophoretic color changing devices 201 are disposed corresponding to the transparent sub areas AA2, and the electrophoretic color changing devices 201 can transition between transparent and opaque states. In the embodiment, the electrophoretic color changing devices 201 of the electrophoretic color changing layer 200 are disposed corresponding to the transparent sub areas AA2. The function and effect of the display device 1000 are described in detail when the display device 1000 is used as glass on a vehicle. When the display device 1000 displays images, the electrophoretic color changing devices 201 can be transformed into the opaque state to improve a display quality of the images, especially low grayscale displayed images having high quality, and at a same time, to block external heat and ultraviolet rays, thereby preventing strong light stimulation to passengers. When the display device 1000 does not display images and the passengers need to observe external environment from the vehicle, the electrophoretic color changing devices 201 can be transformed into the transparent state, the display device 1000 can have a high transmittance effect, and the passengers can observe outside very well.

Embodiment 2

This embodiment is the same as or similar to the above-mentioned embodiment, and a difference is that the structure of the display device 1000 is further described.

In some embodiments, the electrophoretic color changing layer 200 includes a first substrate 51, a second substrate 52, and barrier walls 56, the barrier walls 56 are disposed between the first substrate 51 and the second substrate 52, and the barrier walls 56 are surrounded to form the plurality of electrophoretic color changing devices 201.

Specifically, as shown in FIGS. 1 to 4, each of the electrophoretic color changing devices 201 includes charged particles 57 and a solvent 58, the first substrate 51, the second substrate 52, and the barrier walls 56 are surrounded and form the electrophoretic color changing devices 201, and the charged particles 57 and the solvent 58 are disposed in the space enclosed by the first substrate 51, the second substrate 52, and the barrier walls 56.

Specifically, the barrier walls 56 may be in contact (close contact) with the first substrate 51 and the second substrate 52, or the barrier walls 56 may be bonded with the first substrate 51 and the second substrate 52.

Specifically, the barrier walls 56 are organic materials formed on the first substrate 51, for example, the barrier walls 56 are formed on the first substrate 51 by coating and drying. The barrier walls 56 will be described in detail in subsequent embodiments.

Specifically, the disposition of the barrier walls 56 makes the charged particles 57 and the solvent 58 not overflow or flow out of the electrophoretic color changing devices 201, so that it will not affect other areas such as the display sub areas AA1 or transmission units 202.

In some embodiments, the electrophoretic color changing layer 200 further includes a plurality of transmission units 202, and the transmission units 202 are disposed corresponding to the display sub areas AA1 and between adjacent electrophoretic color changing devices 201.

Specifically, the electrophoretic color changing layer 200 further includes the transmission units 202, and the transmission units 202 provide transmission channels for display light emitted in the display sub areas AA1 or from the light-emitting devices 102.

Specifically, the transmission units 202 correspond to the display sub areas AA1. An orthographic projection of the transmission units 202 on the substrate 11 covers an orthographic projection of the display sub areas AA1 on the substrate 11, or the orthographic projection of the transmission units 202 on the substrate 11 overlaps the orthographic projection of the display sub areas AA1 on the substrate 11.

Specifically, the transmission units 202 being disposed between adjacent electrophoretic color changing devices 201 may be the transmission units 202 and the electrophoretic color changing devices 201 of the electrophoretic color changing layer 200 being alternately disposed, or the transmission units 202 and the electrophoretic color changing devices 201 of the electrophoretic color changing layer 200 being disposed in an array.

Specifically, the transmission units 202 may be filled with air, transparent adhesive materials, etc., or the transmission units 202 may be set to be in a vacuum state, which is not limited herein.

Specifically, the transmission units 202 can improve the transmittance of the display light emitted by the light-emitting devices 102 corresponding to the display sub areas AA1, so that more display light can be emitted and reach the human eye.

In some embodiments, the electrophoretic color changing layer 200 further includes a sealant 53 attached between the first substrate 51 and the second substrate 52, and the sealant 53 is disposed between the first substrate 51 and the second substrate 52 and in the non-display area BB.

Specifically, the electrophoretic color changing layer 200 seals the first substrate 51 and the second substrate 52 by the sealant 53, and the sealant 53 fixes the first substrate 51 and the second substrate 52, thereby improving a mechanical strength of the electrophoretic color changing layer 200 and preventing the first substrate 51 from separating the second substrate 52.

Specifically, the sealant 53 is disposed in the non-display area, so that the sealant 53 will not interfere with or block images displayed by the display panel 100, thereby improving the display effect.

In some embodiments, the electrophoretic color changing layer 200 further includes a first electrode layer 20, the first electrode layer 50 includes first electrodes 54 and second electrodes 55 corresponding to the electrophoretic color changing devices 201 by one to one, and a first electrode 54 and a second electrode 55 in a same electrophoretic color changing device 201 are spaced apart from each other. Each of the electrophoretic color changing devices 201 further includes the charged particles 57 disposed on one side of the first electrodes 54 and the second electrodes 55, and the charged particles 57 can move in the electrophoretic color changing devices 201 according to a voltage change between the first electrodes 54 and the second electrodes 55.

Specifically, after patterning, the first electrode layer 50 at least includes the first electrodes 54 and the second electrodes 55, and each electrophoretic color changing device 20 includes one first electrode 54 and one second electrode 55 corresponding thereto.

Specifically, each of the electrophoretic color changing devices 20 further includes the solvent 58, that is, each of the electrophoretic color changing devices 20 includes the first electrode 54, the second electrode 55, the charged particles 57, and the solvent 58. The charged particles 57 can move in the solvent 58 according to the voltage change between the first electrode 54 and the second electrode 55, thereby realizing the effects of the embodiments in the present disclosure. Therefore, the electrophoretic color changing devices 201 can transition between the transparent and opaque states.

Embodiment 3

This embodiment is the same as or similar to the above-mentioned embodiment, and a difference is that the structure of the display device 1000 is further described.

In some embodiments, both the first electrodes 54 and the second electrodes 55 are disposed on the first substrate 51, or both the first electrodes 54 and the second electrodes 55 are disposed on the second substrate 52.

Specifically, both the first electrodes 54 and the second electrodes 55 are disposed on the first substrate 51, or both the first electrodes 54 and the second electrodes 55 are disposed on the second substrate 52, so that by patterning conductive materials such as metal on the first substrate 51 or the second substrate 52, the first electrodes 54 and the second electrodes 55 can be formed at the same time. Therefore, manufacturing processes can be simplified, and at the same time, the transition of the display device 1000 between the transparent and opaque states can be well realized.

Specifically, as shown in FIGS. 1 to 4, as an example, both the first electrodes 54 and the second electrodes 55 being disposed on the first substrate 51 is illustrated.

In some embodiments, the barrier walls 56 are at least partially disposed on the first electrodes 54 or the second electrodes 55.

Specifically, the barrier walls 56 are at least partially disposed on the first electrodes 54, that is, an orthographic projection of the first electrodes 54 on the first substrate 51 at least partially overlaps an orthographic projection of corresponding barrier walls 56 on the first substrate 51. The barrier walls 56 are at least partially disposed on the second electrodes 55, that is, an orthographic projection of the second electrodes 55 on the first substrate 51 at least partially overlaps an orthographic projection of corresponding barrier walls 56 on the first substrate 51.

Specifically, the barrier walls 56 being at least partially disposed on the first electrodes 54 allows that an area on the first substrate 51 occupied by the first electrodes 54 and barrier walls 56 can be reduced. Therefore, the electrophoretic color changing devices 201 can be set to a smaller size, thereby facilitating increasing an area of the first electrodes 54 corresponding to the transparent sub areas AA2. The barrier walls 56 being at least partially disposed on the second electrodes 55 allows that an area on the first substrate 51 occupied by the second electrodes 55 and barrier walls 56 can be reduced. Therefore, the electrophoretic color changing devices 201 can be set to the smaller size, thereby facilitating increasing the area of the first electrodes 54 corresponding to the transparent sub areas AA2.

In some embodiments, the first electrodes 54 are transparent electrodes, and the first electrodes 54 are disposed corresponding to the transparent sub areas AA2.

Specifically, the first electrodes 54 are disposed corresponding to the transparent sub areas AA2, and the first electrodes 54 are disposed in the transparent sub areas AA2 or a most area of the first electrodes 54 is located in the transparent sub areas AA2.

Specifically, the display device 1000 transitions between the transparent and opaque states according to whether the charged particles 57 gather on the first electrodes 54 or not.

Specifically, the first electrodes 54 may be indium tin oxide (ITO).

Specifically, the first electrodes 54 are the transparent electrodes, and when the transparent sub areas AA2 of the display device 1000 are in the transparent state, the transmittance of ambient light passing through the display device 1000 can be improved.

In some embodiments, the display area AA further includes non-transparent sub areas AA3 between the display sub areas AA1 and the transparent sub areas AA2, and at least a part of the second electrodes 55 is disposed corresponding to the non-transparent sub areas AA3.

Specifically, at least a part of the second electrodes 55 is disposed corresponding to the non-transparent sub areas AA3, the display panel 100 includes a blocking part 80 (as shown by the dashed box in FIG. 2) composed of structures such as driving circuits, traces, and electrodes, and a partial area of the blocking part 80 is located in the non-transparent sub areas AA3.

Specifically, at least a part of the second electrodes 55 being disposed corresponding to the non-transparent sub areas AA3 refers to that a part of the second electrodes 55 is located in the non-transparent sub areas AA3 or the second electrodes 55 are all located in the non-transparent sub areas AA3.

Specifically, the second electrodes 55 may be made of a same material and in a same process as the first electrodes 54.

Specifically, the second electrodes 55 may be made of a different material than the first electrodes 54, for example, the second electrodes 55 may be a non-transparent material.

Specifically, FIGS. 1 and 2 show that the first electrodes 54 and the second electrodes 55 are disposed on the first substrate 51, and the barrier walls 56 are disposed on the first electrodes 54 and the second electrodes 55.

Specifically, by setting at least a part of the second electrodes 55 to be disposed corresponding to the non-transparent sub areas AA3, occupation of the transparent sub areas AA2 by the second electrodes 55 can be reduced or avoided, thereby preventing the charged particles 57 from interfering with or blocking the transparent sub areas when gathering on the second electrodes 55.

Embodiment 4

This embodiment is the same as or similar to the above-mentioned embodiment, and a difference is that the structure of the display device 1000 is further described.

Further, in some embodiments, the first substrate 51 of the electrophoretic color changing layer 200 may be shared with a layer structure of the display panel 100.

Specifically, the first substrate 51 of the electrophoretic color changing layer 200 being shared with the layer structure of the display panel 100 means that the layer structure of the display panel 100 may be used as the first substrate 51 of the electrophoretic color changing layer 200, which includes a situation of the first substrate 51 being the substrate 11 or the encapsulation layer 103 of the display panel 100. Therefore, a thickness of the display device 1000 can be reduced, and the transmittance of the display sub areas AA1 and the transparent sub areas AA2 can be improved. At a same time, directly fabricating other components and structures of the electrochromic layer 200 on the substrate 11 or the encapsulation layer 103 can reduce the fabrication process steps.

In some embodiments, the display panel 100 further includes the encapsulation layer 103 disposed on one side of the light-emitting devices 102 away from the substrate 11, and the first substrate 51 is the substrate 11 or the encapsulation layer 103.

Specifically, as shown in FIGS. 1 to 3, the first substrate 51 is the substrate 11 or the encapsulation layer 103. Therefore, the thickness of the display device 1000 can be reduced, and the transmittance of the display sub areas AA1 and the transparent sub areas AA2 can be improved. At the same time, directly fabricating other components and structures of the electrochromic layer 200 on the substrate 11 or the encapsulation layer 103 can reduce the fabrication process steps.

It should be noted that as shown in FIG. 4, the electrophoretic color changing layer 200 may also be attached to one side of the display panel 100. The first substrate 51 and the second substrate 52 of the electrophoretic color changing layer 200 may not be shared with the layer structure of the display panel 100, and the first substrate 51 of the electrophoretic color changing layer 200 is attached onto the display panel 100 by materials such as an optical adhesive (not shown in the figures).

In some embodiments, the first substrate 51 is the encapsulation layer 103, and both the first electrodes 54 and the second electrodes 55 are disposed on the encapsulation layer 103.

Specifically, when the first substrate 51 is the encapsulation layer 103 and both the first electrodes 54 and the second electrodes 55 are disposed on the encapsulation layer 103, the first electrodes 54 and the second electrodes can be formed directly on the encapsulation layer 103, and the fabrication process of the electrophoretic color changing layer 200 can be at least partially done at a same time as the fabrication process of the display panel 100. Therefore, the process steps can be reduced, and the production costs can be reduced.

In some embodiments, the barrier walls 56 are organic materials formed on the first substrate 51.

Specifically, when the barrier walls 56 are the organic materials, the barrier walls 56 can be deformed to a certain extent, thereby improving an impact resistance of the electrophoretic color changing layer 200.

Specifically, the barrier walls 56 may include a first sub barrier wall layer 561 and a second sub barrier wall layer 562. The first sub barrier wall layer 561 and the second sub barrier wall layer 562 can be made of a same material as the pixel definition layer 25 or/and support columns 26 in the display panel 100, so there is no need to select another material, which can reduce the production costs.

Specifically, the barrier walls 56 may include one of the first sub barrier wall layer 561 or the second sub barrier wall layer 562, and the first sub barrier wall layer 561 or the second sub barrier wall layer 562 is directly fabricated to a required height.

Specifically, the barrier walls 56 may include the first sub barrier wall layer 561 and the second sub barrier wall layer 562, the first sub barrier wall layer 561 is disposed on the first substrate 51, and the second sub barrier wall layer 562 is disposed on the first sub barrier wall layer 561. The second sub barrier wall layer 562 is in contact with the second substrate 52 or is attached to the second substrate 52. By disposing the barrier walls 56 in a two-layered or multi-layered structure, the barrier walls 56 formed can have a higher height, thereby satisfying the requirements of the electrophoretic color changing layer 200.

Embodiment 5

This embodiment is the same as or similar to the above-mentioned embodiment, and a difference is that the structure of the display device 1000 is further described.

In some embodiments, the display panel 100 further includes the encapsulation layer 103 and transistors 70 (as shown by the dashed box in FIG. 2) and openings 91 disposed between the substrate 11 and the encapsulation layer 103, the light-emitting devices 102 are disposed on the transistors 70, the encapsulation layer 103 is disposed on the light-emitting devices 102, the openings 91 are defined corresponding to the transparent sub areas AA2 and penetrate at least inorganic material film layers of the transistors 70, and a filling material 92 in the openings 91 includes an organic material.

Specifically, the display panel 100 includes the substrate 11, the transistors 70 disposed on the substrate 11, the light-emitting devices 102 disposed on the transistors 70, and the encapsulation layer 103 disposed on the light-emitting devices 102. Each of the transistors 70 includes a semiconductor layer 16, a gate insulating layer 17, a gate electrode 18, an interlayer insulating layer 21, a source electrode 71, and a drain electrode 72. The openings 91 penetrate at least the inorganic material film layers of the transistors 70, that is, the openings 91 penetrate at least the gate insulating layer 17 and the interlayer insulating layer 21.

Specifically, when the display panel 100 further includes other inorganic material film layers disposed on the substrate 11, or when the transistors 70 further include other inorganic material film layers, the openings 91 may also penetrate other inorganic material film layers.

Specifically, as shown in FIGS. 1 and 2, a structure of the display panel 100 is taken as an example. The layer structure of the display panel includes the substrate 11, a buffer layer 15, the semiconductor layer 16, the gate insulating layer 17, the gate electrode 18, a first insulating layer 19, a first metal layer 20, the interlayer insulating layer 21, a second metal layer 22, a planarization layer 23, the anode 24, the pixel definition layer 25, a support column 26, the cathode 27, and the encapsulation layer 103 in sequence. Wherein, the encapsulation layer 103 includes a first inorganic encapsulation layer 28, a first organic encapsulation layer 29, and a second inorganic encapsulation layer 30. The encapsulation layer 103 is a multi-layer laminated structure of inorganic layers and organic layers. Wherein, the second metal layer 22 includes the source electrode 71 and the drain electrode 72.

Specifically, as shown in FIGS. 1 and 2, as an example, the openings 91 penetrate the buffer layer 15, the gate insulating layer 17, the first insulating layer 19, the interlayer insulating layer 21, the planarization layer 23, the pixel definition layer 25, and the cathode 27.

Specifically, the openings 91 are defined corresponding to the transparent sub areas AA2, that is, the openings 91 are located in the transparent sub areas AA2.

Specifically, the filling material 92 in the openings 91 includes an organic material, and the organic material has a high transmittance, specifically, a transparent organic material, which can improve the transmittance of the transparent sub areas.

Further, in some embodiments, the encapsulation layer 103 is filled in the openings 91.

Specifically, by filling the encapsulation layer 103 in the openings 91, water vapor and oxygen can be prevented from entering the display panel 100 through the openings 91, thereby improving the service life and reliability of the display panel 100.

Embodiment 6

This embodiment is the same as or similar to the above-mentioned embodiment, and a difference is that the structure of the display device 1000 in any one of the above embodiments is further described, especially the structure of the display device 1000 in the embodiments shown in FIGS. 1 and 2.

Figure 5:
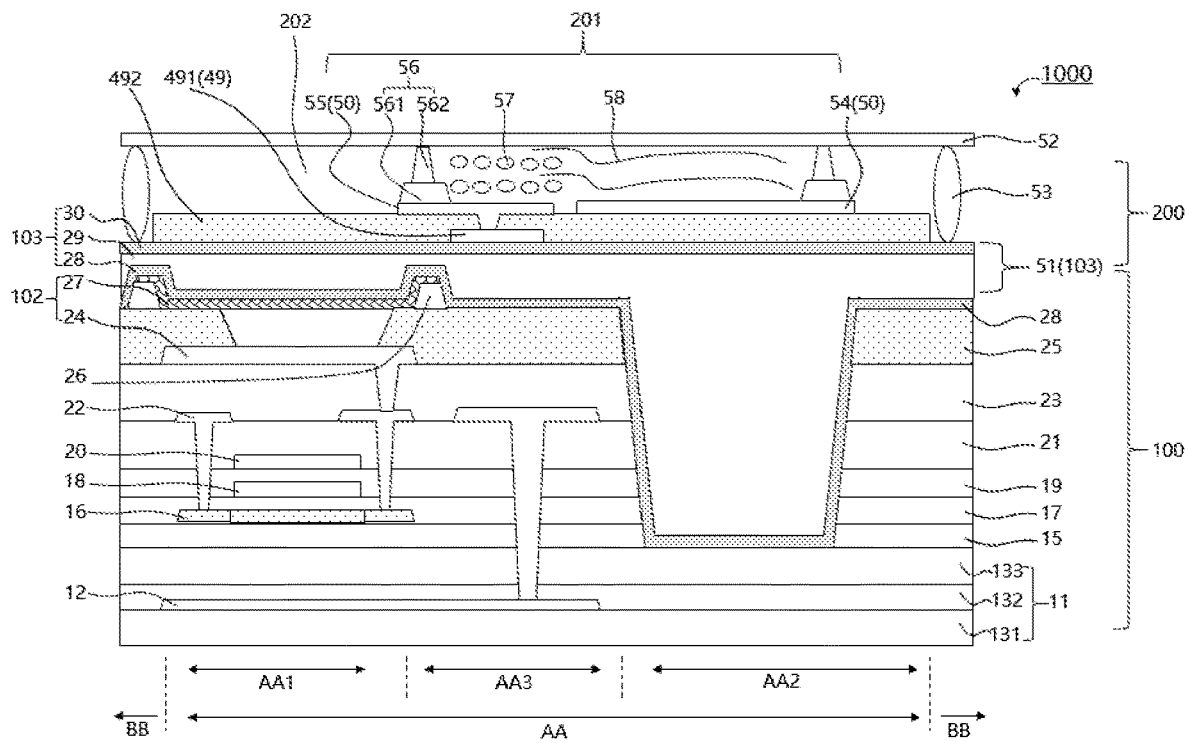
FIG. 5 is a fifth schematic cross-sectional structural diagram of the display device according to an embodiment of the present disclosure.
Figure 6:
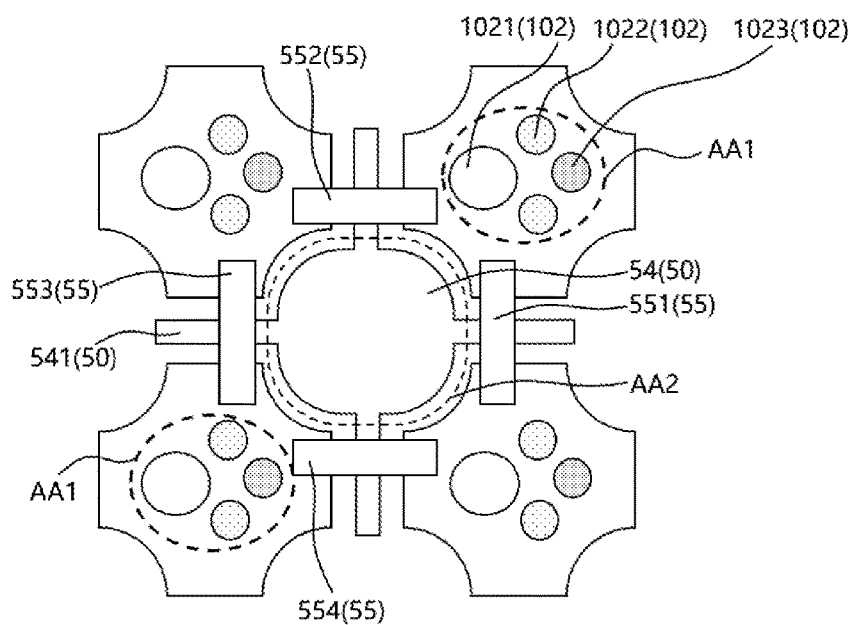
FIG. 6 is a schematic top view of a partial structure of an electrophoretic color changing layer of the display device according to an embodiment of the present disclosure.
Figure 7:
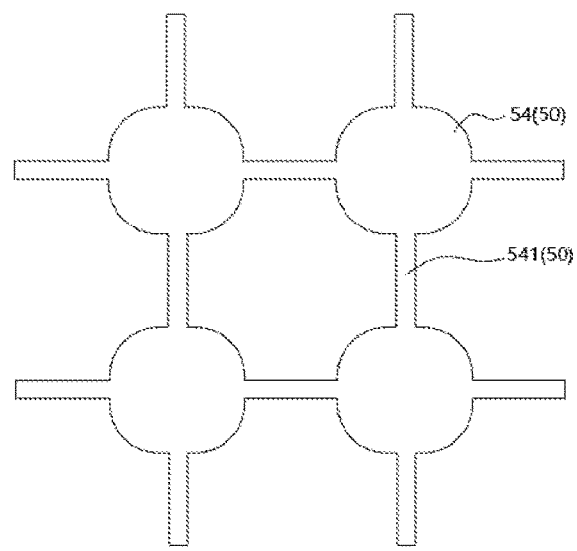
FIG. 7 is a partial schematic top view of first electrodes of the display device according to an embodiment of the present disclosure.

Referring to FIGS. 5 to 7, FIG. 5 is a fifth schematic cross-sectional structural diagram of the display device 1000 according to an embodiment of the present disclosure; FIG. 6 is a schematic top view of a partial structure of the electrophoretic color changing layer of the display device 1000 according to an embodiment of the present disclosure; and FIG. 7 is a partial schematic top view of the first electrodes of the display device 1000 according to an embodiment of the present disclosure.

In some embodiments, the electrophoretic color changing layer 200 further includes a second electrode layer 49 and an isolation insulating layer 492 disposed on the first substrate 51 or the second substrate 52. The second electrode layer 49 is disposed between the first electrode layer 50 and the first substrate 51 or between the first electrode layer 50 and the second substrate 52. The isolation insulating layer 492 is disposed between the first electrode layer 50 and the second electrode layer 49, and the first electrode layer 50 and the second electrode layer 49 are disposed on a same substrate. The first electrode layer 50 further includes connection electrodes 541 connected between adjacent first electrodes 54. The second electrode layer 49 further includes first wirings 491, and the second electrodes 55 are electrically connected to each other by the first wirings 491.

Specifically, the settings of the first electrode layer 50 and the second electrode layer 49 include: a) the first electrode layer 50 and the second electrode layer 49 are both disposed on the first substrate 51, the second electrode layer 49 is disposed on the first substrate 51, the isolation insulating layer 492 is disposed on the second electrode layer 49, the first electrode layer is disposed on the isolation insulating layer 492, and the charged particles 57 are disposed on one side of the first electrode layer 50 away from the second electrode layer 49; and b) the first electrode layer 50 and the second electrode layer 49 are both disposed on the second substrate 52, the second electrode layer 49 is disposed on the second substrate 52, the isolation insulating layer 492 is disposed on the second electrode layer 49, the first electrode layer 50 is disposed on the isolation insulating layer 492, and the charged particles 57 are disposed on one side of the first electrode layer 50 away from the second electrode layer 49.

Specifically, patterned first electrode layer 50 includes the first electrodes 54, the second electrodes 55, and the connection electrodes 541. Two first electrodes 54 corresponding to two adjacent electrophoretic color changing devices 201 are connected to each other by one of the connection electrodes 541. Therefore, the plurality of first electrodes 54 corresponding to the plurality of electrophoretic color changing devices 201 of the electrophoretic color changing layer 200 can be electrically connected together by the plurality of connection electrodes 541.

Specifically, patterned second electrode layer 49 includes the wirings 491. The plurality of second electrodes 55 are electrically connected to each other by the first wirings 491. Electrical signals of the plurality of second electrodes 55 are supplied through the first wirings 491, so that the plurality of second electrodes 55 corresponding to the plurality of electrophoretic color changing devices 201 of the electrophoretic color changing layer 200 are electrically connected together by the plurality of first wirings 491.

In some embodiments, at least three light-emitting devices 102 having different colors are disposed in one display sub area AA1, the transparent sub areas AA2 are disposed between adjacent display sub areas AA1, and in the same electrophoretic color changing device 201, the second electrode 55 is disposed on at least one side of the first electrode 54.

Specifically, as shown in FIG. 6, as an example, one green light-emitting device 1021, two blue light-emitting devices 1022, and one red light-emitting device 1023 disposed in the one display sub area AA1 are illustrated, but are not limited to this.

Specifically, in the same electrophoretic color changing device 201, the second electrode 55 is disposed on at least one side of the first electrode 54. The second electrode 55 corresponding to one electrophoretic color changing device 201 may include one or more of a first sub electrode 551, a second sub electrode 552, a third sub electrode 553, and a fourth sub electrode 554. When the second electrode 55 corresponding to the one electrophoretic color changing device 201 includes one of the first sub electrode 551, the second sub electrode 552, the third sub electrode 553, or the fourth sub electrode 554, the second electrode 55 is disposed on one side of the first electrode 54. When the second electrode 55 corresponding to the one electrophoretic color changing device 201 includes two of the first sub electrode 551, the second sub electrode 552, the third sub electrode 553, or the fourth sub electrode 554, the second electrode 55 is disposed on both sides of the first electrode 54, which is not repeated herein.

Embodiment 7

This embodiment is the same as or similar to the above-mentioned embodiment, and a difference is that the working process of the display device 1000 in any one of the above embodiments is described.

In some embodiments, when a first voltage is applied between the first electrodes 54 and the second electrodes 55, the charged particles 57 are gathered on the first electrodes 54, and the transparent sub areas AA2 are in the opaque state. When a second voltage is applied between the first electrodes 54 and the second electrodes 55, the charged particles 57 are gathered on the second electrodes 55, and the transparent sub areas AA2 are in the transparent state. Wherein, the first voltage and the second voltage are reverse voltages.

Specifically, as shown in FIG. 8, when the first voltage is applied between the first electrodes 54 and the second electrodes 55, the charged particles 57 are gathered on the first electrodes 54 and shield the transparent sub areas AA2, and the transparent sub areas AA2 are in the opaque state. The function and effect of the display device 1000 are described in detail when the display device 1000 is used as glass on a vehicle. When the display device 1000 displays images, the electrophoretic color changing devices 201 can be transformed into the opaque state to improve the display quality of the images, especially to have low grayscale displayed images having high quality, and at the same time, to block external heat and ultraviolet rays, thereby preventing strong light stimulation to passengers.

Specifically, as shown in FIG. 9, when the second voltage is applied between the first electrodes 54 and the second electrodes 55, the charged particles 57 are gathered on the second electrodes 55 and do not shield the transparent sub areas AA2, and the transparent sub areas AA2 are in the transparent state. When the display device 1000 does not display images and the passengers need to observe external environment from the vehicle, the electrophoretic color changing devices 201 can be transformed into the transparent state, the display device 1000 can have the high transmittance effect, and the passengers can observe outside very well.

In some embodiments, when a third voltage is applied between the first electrodes 54 and the second electrodes 55, the charged particles 57 are distributed on the first electrodes 54 and the second electrodes 55, the transparent sub areas AA2 are in a grayscale state, and an absolute value of the third voltage is less than an absolute value of the first voltage and an absolute value of the second voltage.

Specifically, as shown in FIG. 10, the third voltage is an intermediate voltage between the first voltage and the second voltage, so that a part of the charged particles 57 are distributed on the first electrodes 54, and another part of the charged particles 57 are distributed on the second electrodes 55, so that the charged particles 57 partially shield the transparent sub areas AA2, thereby improving the contrast of low grayscale images. At this time, the passengers can not only watch images with better display quality, but also observe a situation outside the vehicle at the same time.

Specifically, as shown in FIG. 10, when the third voltage is not applied between the first electrodes 54 and the second electrodes 55, that is, when the third voltage is 0 V, the transparent sub areas AA2 are also in the grayscale state.

It should be noted that the first state of the display device 1000 shown in FIG. 5 is the opaque state; the second state of the display device 1000 shown in FIG. 6 is the transparent state; and the third state of the display device 1000 shown in FIG. 10 is the grayscale state.

It should be noted that when the charged particles 57 are black charged particles, the first state or the opaque state of the display device 1000 is a black state of the electrophoretic color changing devices 201.

It should be noted that in the display device of any one of the above embodiments, the charged particles 57 may be the black charged particles, and the charged particles 57 may be positively charged or negatively charged. The charged particles 57 may be black particles, such as TiOx, carbon black, or aniline black, wrapped by spherical resin materials, and the resin materials may be polyethylene, polystyrene, polyacrylate, or polyester. A diameter of the charged particles 57 is preferably less than 0.5 microns, and more preferably less than 0.1 microns, such as 20 nm to 50 nm. If the diameter of the charged particles 57 is smaller, it is better to improve the opacity of the opaque state, and a plurality of uniformly dispersed black particles can be arranged in the spherical resin material.

It should be noted that in the display device of any one of the above embodiments, the sealant 53 may be an ultraviolet curing glue (UV glue).

It should be noted that in the display device of any one of the above embodiments, the solvent 58 is a transparent insulating organic solvent. A main component of the solvent 58 may be a hydrocarbon-based organic solvent such as benzene, toluene, xylene, or cyclohexane. The solvent 58 may also contain at least one of a dispersing agent, a surfactant, a decomposition stabilizer, a light stabilizer, a charge control agent, or a low-volatile component. In order to reduce a resistance to particle movement and thus reduce a driving voltage between the first electrodes 54 and the second electrodes 55, a viscosity of the solvent 58 is preferably less than 40 mPa·s.

It should be noted that the substrate 11 may be a flexible substrate, and when the substrate 11 is a flexible substrate, the substrate 11 may include a first sub substrate 131, a second sub substrate 133, and a second insulating layer 132 sandwiched between the first sub substrate 131 and the second sub substrate 133; or the substrate 11 may include a light-shielding layer 12 disposed between the first sub substrate 131 and the second sub substrate 133, which is not limited herein.

It should be noted that the first wirings 491 or/and the connection electrodes 541 may extend to the non-display area BB, and may be electrically connected to a driving chip by soldering silver paste or bonding in the non-display area BB.

Embodiment 8

An embodiment of the present disclosure further provides a vehicle 2000, which includes the display device 1000 mentioned in any one of the above embodiments.

Figure 11:
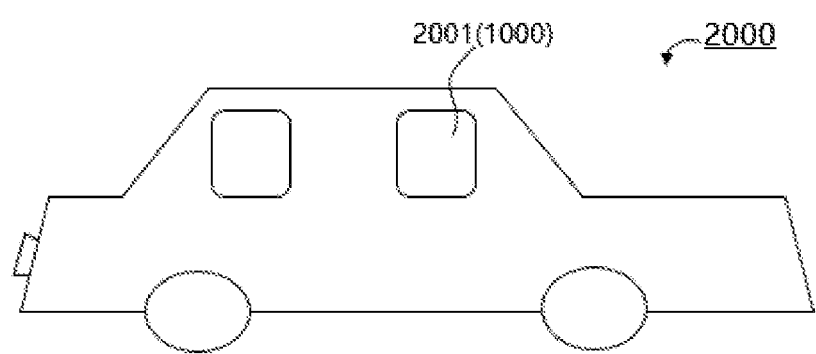
FIG. 11 is a schematic diagram of a vehicle according to an embodiment of the present disclosure.

Referring to FIG. 11, FIG. 11 is a schematic diagram of the vehicle according to an embodiment of the present disclosure.

Specifically, as shown in FIG. 10, the vehicle 2000 includes glass 2001, such as car window glass, the display device 1000 may be used on the glass 2001, or the display device 1000 may be directly used as the glass 2001. Therefore, the vehicle 2000 can have the beneficial effects described in the display device 1000 in the above embodiments, which are not repeated herein.

The display device and the vehicle provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

The is claimed is:

1. A display device, having a display area and a non-display area surrounding at least a part of the display area, wherein the display area comprises a plurality of display sub areas and a plurality of transparent sub areas arranged in an array, and the display device comprises: a display panel comprising a substrate and a plurality of light-emitting devices disposed on the substrate, wherein the light-emitting devices are disposed corresponding to the display sub areas; and an electrophoretic color changing layer disposed on one side of the display panel; wherein the electrophoretic color changing layer comprises a plurality of electrophoretic color changing devices, the electrophoretic color changing devices are disposed corresponding to the transparent sub areas, and the electrophoretic color changing devices transition between a transparent state and an opaque state; wherein the electrophoretic color changing layer comprises a first substrate, a second substrate, and barrier walls; wherein the electrophoretic color changing layer further comprises a first electrode layer, the first electrode layer comprises first electrodes and second electrodes corresponding to the electrophoretic color changing devices one to one, and the first electrodes and the second electrodes in a same electrophoretic color changing device are spaced apart from each other; and each of the electrophoretic color changing devices further comprises charged particles disposed on one side of the first electrodes and the second electrodes, and the charged particles move in the electrophoretic color changing devices according to a voltage change between the first electrodes and the second electrodes; and wherein at least three light-emitting devices having different colors are disposed in one display sub area, the transparent sub areas are disposed between adjacent display sub areas, and in the same electrophoretic color changing device, each of the second electrodes is disposed on at least one side of each of the first electrodes.

2. The display device according to claim 1, wherein the electrophoretic color changing layer further comprises a plurality of transmission units, and the transmission units are disposed corresponding to the display sub areas and between adjacent electrophoretic color changing devices.

3. The display device according to claim 1, wherein the electrophoretic color changing layer further comprises a sealant attached between the first substrate and the second substrate, and the sealant is disposed between the first substrate and the second substrate and in the non-display area.

4. The display device according to claim 1, wherein the first electrode layer is disposed on the first substrate or the second substrate.

5. The display device according to claim 4, wherein the first electrodes are transparent electrodes, and the first electrodes are disposed corresponding to the transparent sub areas.

6. The display device according to claim 5, wherein the display area further comprises non-transparent sub areas between the display sub areas and the transparent sub areas, and the second electrodes are at least partially disposed corresponding to the non-transparent sub areas.

7. The display device according to claim 6, wherein the electrophoretic color changing layer further comprises a second electrode layer and an isolation insulating layer disposed on the first substrate or the second substrate, the second electrode layer is disposed between the first electrode layer and the first substrate or between the first electrode layer and the second substrate, the isolation insulating layer is disposed between the first electrode layer and the second electrode layer, and the first electrode layer and the second electrode layer are disposed on a same substrate;
the first electrode layer further comprises connection electrodes connected between adjacent first electrodes; and
the second electrode layer further comprises first wirings, and the second electrodes are electrically connected to each other by the first wirings.

8. The display device according to claim 4, wherein the barrier walls are at least partially disposed on the first electrodes or the second electrodes.

9. The display device according to claim 4, wherein the display panel further comprises an encapsulation layer disposed on one side of the light-emitting devices away from the substrate, and the first substrate is the substrate of the display panel or the encapsulation layer of the display panel.

10. The display device according to claim 9, wherein the first substrate is the encapsulation layer, and both the first electrodes and the second electrodes are disposed on the encapsulation layer.

11. The display device according to claim 9, wherein the barrier walls are organic materials formed on the first substrate.

12. The display device according to claim 1, wherein the display panel further comprises an encapsulation layer and transistors and openings disposed between the substrate and the encapsulation layer, the light-emitting devices are disposed on the transistors, the encapsulation layer is disposed on the light-emitting devices, the openings are defined corresponding to the transparent sub areas and penetrate at least inorganic material film layers of the transistors, and a filling material in the openings comprises an organic material.

13. The display device according to claim 1, wherein when a first voltage is applied between the first electrodes and the second electrodes, the charged particles are gathered on the first electrodes, and the transparent sub areas are in the opaque state;
when a second voltage is applied between the first electrodes and the second electrodes, the charged particles are gathered on the second electrodes, and the transparent sub areas are in the transparent state; and
wherein the first voltage and the second voltage are reverse voltages.

14. The display device according to claim 13, wherein when a third voltage is applied between the first electrodes and the second electrodes, the charged particles are distributed on the first electrodes and the second electrodes, the transparent sub areas are in a grayscale state, and an absolute value of the third voltage is less than an absolute value of the first voltage and an absolute value of the second voltage.

15. A vehicle, comprising the display device according to claim 1.

16. The display device according to claim 1, wherein the barrier walls comprise a first sub barrier wall layer and a second sub barrier wall layer, the first sub barrier wall layer is disposed on the first substrate, the second sub barrier wall layer is disposed on the first sub barrier wall layer, and the second sub barrier wall layer is attached with the second substrate, wherein an orthographic projection of the second sub barrier wall layer on the first substrate is in an orthographic projection of the first sub barrier wall layer on the first substrate.

17. A display device, having a display area and a non-display area surrounding at least a part of the display area, wherein the display area comprises a plurality of display sub areas and a plurality of transparent sub areas arranged in an array, and the display device comprises: a display panel comprising a substrate and a plurality of light-emitting devices disposed on the substrate, wherein the light-emitting devices are disposed corresponding to the display sub areas; and an electrophoretic color changing layer disposed on one side of the display panel; wherein the electrophoretic color changing layer comprises a plurality of electrophoretic color changing devices, the electrophoretic color changing devices are disposed corresponding to the transparent sub areas, and the electrophoretic color changing devices transition between a transparent state and an opaque state; wherein the electrophoretic color changing layer further comprises a first electrode layer, the first electrode layer comprises first electrodes and second electrodes corresponding to the electrophoretic color changing devices one to one, and the first electrodes and the second electrodes in a same electrophoretic color changing device are spaced apart from each other; and each of the electrophoretic color changing devices further comprises charged particles disposed on one side of the first electrodes and the second electrodes, and the charged particles move in the electrophoretic color changing devices according to a voltage change between the first electrodes and the second electrodes; wherein the display area further comprises non-transparent sub areas between the display sub areas and the transparent sub areas, and the second electrodes are at least partially disposed corresponding to the non-transparent sub areas.

18. A display device, having a display area and a non-display area surrounding at least a part of the display area, wherein the display area comprises a plurality of display sub areas and a plurality of transparent sub areas arranged in an array, and the display device comprises: a display panel comprising a substrate and a plurality of light-emitting devices disposed on the substrate, wherein the light-emitting devices are disposed corresponding to the display sub areas; and an electrophoretic color changing layer disposed on one side of the display panel; wherein the electrophoretic color changing layer comprises a plurality of electrophoretic color changing devices, the electrophoretic color changing devices are disposed corresponding to the transparent sub areas, and the electrophoretic color changing devices transition between a transparent state and an opaque state; wherein the electrophoretic color changing layer further comprises a first electrode layer, the first electrode layer comprises first electrodes and second electrodes corresponding to the electrophoretic color changing devices one to one, and the first electrodes and the second electrodes in a same electrophoretic color changing device are spaced apart from each other; and each of the electrophoretic color changing devices further comprises charged particles disposed on one side of the first electrodes and the second electrodes, and the charged particles move in the electrophoretic color changing devices according to a voltage change between the first electrodes and the second electrodes; when a first voltage is applied between the first electrodes and the second electrodes, the charged particles are gathered on the first electrodes, and the transparent sub areas are in the opaque state; when a second voltage is applied between the first electrodes and the second electrodes, the charged particles are gathered on the second electrodes, and the transparent sub areas are in the transparent state; and wherein the first voltage and the second voltage are reverse voltages; and when a third voltage is applied between the first electrodes and the second electrodes, the charged particles are distributed on the first electrodes and the second electrodes, the transparent sub areas are in a grayscale state, and an absolute value of the third voltage is less than an absolute value of the first voltage and an absolute value of the second voltage.

* * * * *